(12) United States Patent
Kim et al.

(10) Patent No.: US 12,107,550 B2
(45) Date of Patent: Oct. 1, 2024

(54) LINEARIZATION OF DIFFERENTIAL RF POWER AMPLIFIER BY BIAS CONTROL USING CROSS-COUPLING COMPONENTS

(71) Applicant: Avago Technologies International Sales Pte. Limited, Singapore (SG)

(72) Inventors: Jooseung Kim, Seoul (KR); Jung Min Oh, Seoul (KR); Moon Suk Jeon, Seoul (KR)

(73) Assignee: Avago Technologies International Sales Pte. Limited, Singapore (SG)

( * ) Notice: Subject to any disclaimer, the term of this patent is extended or adjusted under 35 U.S.C. 154(b) by 341 days.

(21) Appl. No.: 17/733,605

(22) Filed: Apr. 29, 2022

(65) Prior Publication Data
US 2023/0353095 A1 Nov. 2, 2023

(51) Int. Cl.
*H03F 1/02* (2006.01)
*H03F 1/56* (2006.01)
(Continued)

(52) U.S. Cl.
CPC ........... *H03F 1/0211* (2013.01); *H03F 1/565* (2013.01); *H03F 3/245* (2013.01);
(Continued)

(58) Field of Classification Search
CPC ...... H03F 1/0211; H03F 1/0266; H03F 1/565; H03F 2200/06; H03F 2200/09;
(Continued)

(56) References Cited

U.S. PATENT DOCUMENTS 4,223,275 A  9/1980  Brinker
4,242,634 A  12/1980  Metcalf
(Continued)

FOREIGN PATENT DOCUMENTS

GB  2331647 A  5/1999
RU  2310267 C1  11/2007

OTHER PUBLICATIONS

Ullah, F. et al., "Bandwidth-Enhanced Differential LC-Voltage Controlled Oscillator (LC-VCO) and Superharmonic Coupled Quadrature VCO for K-Band Applications", Electronics 2018, 7, 127, https://doi.org/10.3390/electronics7080127, downloaded Dec. 29, 2021.

*Primary Examiner* — Nguyen T Vo
(74) *Attorney, Agent, or Firm* — Quarles & Brady LLP

(57) ABSTRACT

An amplifier may include first and second terminals to receive first and second input signals and a differential amplifier providing differential amplification of the first and second input signals. The differential amplifier may include a first differential amplifier stage to receive the first input signal and a second differential amplifier stage to receive the second input signal. The amplifier may further include a first bias circuit to bias the first differential amplifier stage, where the first bias circuit is connected to the second input terminal to provide anti-phase bias control of the first differential amplifier stage. The amplifier may further include a second bias circuit to bias the second differential amplifier stage, where the second bias circuit is connected to the first input terminal to provide anti-phase bias control of the second differential amplifier stage.

20 Claims, 17 Drawing Sheets

(51) Int. Cl.
*H03F 3/24* (2006.01)
*H03F 3/45* (2006.01)
*H04B 1/04* (2006.01)

(52) U.S. Cl.
CPC ........... *H03F 3/45165* (2013.01); *H04B 1/04* (2013.01); *H03F 2200/222* (2013.01); *H03F 2200/318* (2013.01); *H03F 2200/387* (2013.01); *H03F 2200/451* (2013.01)

(58) Field of Classification Search
CPC ......... H03F 2200/222; H03F 2200/318; H03F 2200/387; H03F 2200/42; H03F 2200/451; H03F 2203/45156; H03F 2203/45228; H03F 2203/45544; H03F 3/19; H03F 3/245; H03F 3/45165; H03F 3/45475; H04B 1/04
See application file for complete search history.

(56) References Cited

U.S. PATENT DOCUMENTS

| | | |
|---|---|---|
| 6,313,705 B1 | 11/2001 | Dening et al. |
| 7,697,915 B2 | 4/2010 | Behzad et al. |
| 7,893,684 B2 | 2/2011 | Kobayashi et al. |
| 10,284,148 B2 | 5/2019 | D'Avino et al. |
| 2003/0218506 A1 | 11/2003 | Noh et al. |
| 2010/0327969 A1* | 12/2010 | Jung .................. H03F 3/72 330/124 R |
| 2022/0123698 A1* | 4/2022 | Goto ................... H03F 3/4508 |
| 2022/0345093 A1* | 10/2022 | Yang .................... H03F 3/189 |

* cited by examiner

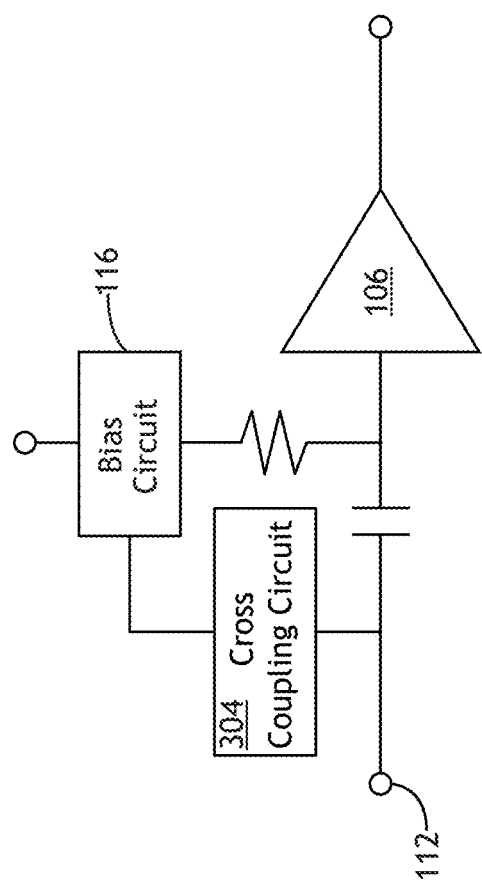

LINEARIZATION OF DIFFERENTIAL RF POWER AMPLIFIER BY BIAS CONTROL USING CROSS-COUPLING COMPONENTS

TECHNICAL FIELD

The present disclosure relates generally to radio-frequency (RF) power amplifiers and, more particularly, to RF amplifiers in communication devices.

BACKGROUND

Advanced mobile communications systems such as 5G adopt spectrally efficient complex modulation schemes to achieve high data throughput within limited spectrum resources. Radio frequency (RF) power amplifiers (PAs) are a critical component of such communications systems. Further, advanced communications systems impose increasingly strict requirements of RF PAs in order to meet technical requirements such as high peak-to-average power ratios (PAPRs) and ultra-wideband signal while maintaining a high efficiency. Maintaining efficiency is particularly important in mobile applications since the efficiency directly impacts battery lifetimes and heat management issues. There is therefore a need to develop systems and methods for high-performance and efficient power amplification.

SUMMARY

An amplification device is disclosed in accordance with one or more illustrative embodiments. In one illustrative embodiment, the amplification device includes a first input terminal to receive a first input signal and a second input terminal to receive a second input signal. In another illustrative embodiment, the amplification device includes a differential amplifier providing differential amplification of the first and second input signals, where the differential amplifier includes a first differential amplifier stage to receive the first input signal and a second differential amplifier stage to receive the second input signal. In another illustrative embodiment, the amplification device includes a first bias circuit including a first buffer to bias the first differential amplifier stage, where the first bias circuit is connected to the second input terminal to provide anti-phase bias control of the first differential amplifier stage. In another illustrative embodiment, the amplification device includes a second bias circuit including a second buffer to bias the second differential amplifier stage, where the second bias circuit is connected to the first input terminal to provide anti-phase bias control of the second differential amplifier stage.

A multi-stage amplifier is disclosed in accordance with one or more illustrative embodiments. In one illustrative embodiment, the multi-stage amplifier includes two or more amplifier stages, where at least one of the two or more amplifier stages includes a first input terminal to receive a first input signal, a second input terminal configured to receive a second input signal, and a differential amplifier providing differential amplification of the first and second input signals. In another illustrative embodiment, the differential amplifier includes a first differential amplifier stage including one or more transistors and configured to receive the first input signal and a second differential amplifier stage including one or more transistors and configured to receive the second input signal. In another illustrative embodiment, the differential amplifier further includes a first bias circuit including a first buffer to bias the first differential amplifier stage, where the first bias circuit is connected to the second input terminal to provide anti-phase bias control of the first differential amplifier stage. In another illustrative embodiment, the differential amplifier further includes a second bias circuit including a second buffer to bias the second differential amplifier stage, where the second bias circuit is connected to the first input terminal to provide anti-phase bias control of the second differential amplifier stage.

A communications device is disclosed in accordance with one or more illustrative embodiments. In one illustrative embodiment, the communications device includes a transmitter to generate an input transmission signal. In another illustrative embodiment, the communications device includes one or more amplifiers to receive the input transmission signal. In another illustrative embodiment, at least one of the one or more amplifiers includes an input transformer to receive the input transmission signal and generate a first input signal and a second input signal, a first input terminal to receive the first input signal, a second input terminal configured to receive the second input signal, and a differential amplifier providing differential amplification of the first and second input signals. In another illustrative embodiment, the differential amplifier includes a first differential amplifier stage including one or more transistors and configured to receive the first input signal and a second differential amplifier stage including one or more transistors and configured to receive the second input signal. In another illustrative embodiment, the differential amplifier further includes a first bias circuit including a first buffer to bias the first differential amplifier stage, where the first bias circuit is connected to the second input terminal to provide anti-phase bias control of the first differential amplifier stage. In another illustrative embodiment, the differential amplifier further includes a second bias circuit including a second buffer to bias the second differential amplifier stage, where the second bias circuit is connected to the first input terminal to provide anti-phase bias control of the second differential amplifier stage, wherein the first and second differential amplifier stages provide first and second amplified output signals. In another illustrative embodiment, the communications device further includes an output transformer configured to receive the first and second amplified output signals and generate an amplified transmission signal. In another illustrative embodiment, the communications device further includes an antenna configured to broadcast the amplified transmission signal.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 3A is a conceptual block diagram of an amplifier including a traditional coupling circuit to couple a bias circuit to an input signal, in accordance with one or more embodiments of the present disclosure.

DETAILED DESCRIPTION

Reference will now be made in detail to the subject matter disclosed, which is illustrated in the accompanying drawings. The present disclosure has been shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to a highly linear differential radio frequency (RF) power amplifier (PA) utilizing anti-phase bias control based on cross-coupled anti-phase signals.

It is contemplated herein that achieving high efficiency RF power amplification in advanced systems such as, but not limited to, mobile communications systems, may require advances in RF PA design beyond existing technologies. For example, existing techniques such as envelope tracking (ET) with digital pre-distortion (DPD) may provide reasonable efficiency and linearity for some less-demanding applications. For example, ET may replace a fixed DC supply with a dynamic supply voltage and DPD may linearize an output signal by applying a pre-distorted input signal at the input of the RF PA. However, the performance of such techniques may be limited in advanced systems such as, but not limited to, 5G communications systems since the relatively high peak-to-average power ratios (PAPRs) and ultra-wideband signals may cause distortion of a supply voltage as well as RF dispersion.

It is further contemplated herein that anti-phase bias control of amplifier stages within a differential RF amplifier based on cross-coupled signals from opposing inputs provides highly linear performance suitable for a wide variety of demanding applications including, but not limited to 5G mobile communication systems. Further, a highly linear differential RF amplifier as disclosed herein may provide substantial flexibility for amplifier system design. In some applications, reliance on techniques such as ET or DPD may be reduced or eliminated. In some applications, the systems and methods disclosed herein may enable increased performance of techniques such as ET or DPD since the ranges of such techniques may be less stressed.

Referring now to FIGS. 1A-8, systems and methods for providing a highly linear differential RF PA are described in greater detail, in accordance with one or more embodiments of the present disclosure.

Figure 1A:
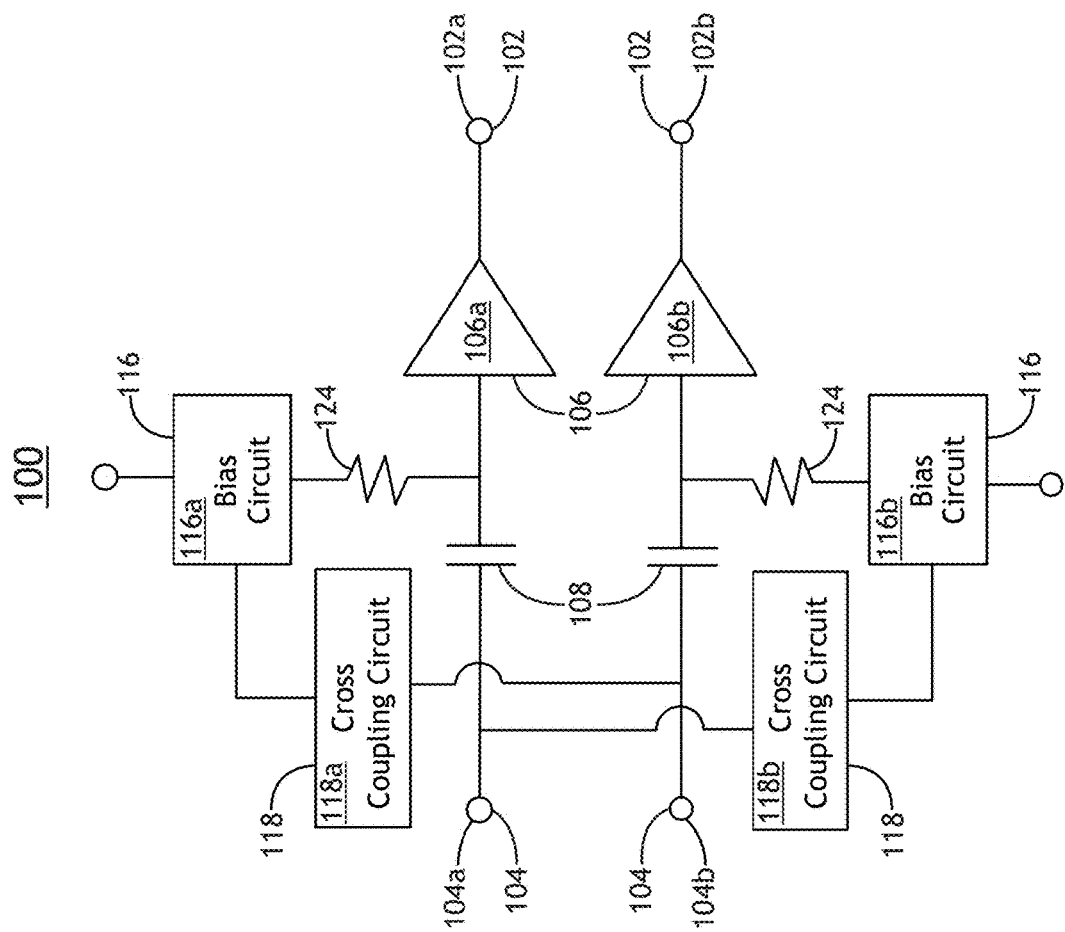
FIG. 1A is a conceptual diagram of a cross-coupled differential amplifier, in accordance with one or more embodiments of the present disclosure.

FIG. 1A is a conceptual diagram of a cross-coupled differential amplifier 100, in accordance with one or more embodiments of the present disclosure. In particular, the cross-coupled differential amplifier 100 is a differential amplifier providing an in-phase differential output signal 102a (e.g., a first output signal) and an out-of-phase differential output signal 102b (e.g., a second output signal) (referred to herein collectively as differential output signals 102) based on differential amplification of an in-phase differential input signal 104a (e.g., a first input signal) and an out-of-phase differential input signal 104b (e.g., a second input signal) (referred to herein collectively as differential input signals 104).

The cross-coupled differential amplifier 100 may operate on differential input signals 104 of any frequency, frequency ranges, or frequency bands. For example, the differential input signals 104 may have, but are not limited to, frequencies in the range of MHz to GHz. In some embodiments, the cross-coupled differential amplifier 100 has an operational range including frequencies suitable for communication in spectral bands allocated for 5G communications such as, but not limited to, frequencies ranging from 410 MHz to 7125 MHz (e.g., Frequency Range 1) for frequencies ranging from 24.25 GHz to 52.6 GHz (Frequency Range 2). In some embodiments, the cross-coupled differential amplifier 100 has an operational range including frequencies suitable for communication in spectral bands allocated for Long Term Evolution (LTE) communications such as, but not limited to, FDD or TDD LTE frequency bands. However, it is to be understood that the cross-coupled differential amplifier 100 disclosed herein is not limited to an operational range associated with any particular communications standard. Rather, references to any particular frequency, frequency band, or communication standard are solely for illustrative purposes and should not be interpreted as limiting.

The cross-coupled differential amplifier 100 may have any architecture known in the art suitable for providing differential amplification. In some embodiments, the cross-coupled differential amplifier 100 includes an in-phase differential amplifier stage 106a (e.g., a first differential amplifier stage) to accept the in-phase differential input signal 104a and an out-of-phase differential amplifier stage 106b (e.g., a second differential amplifier stage) to accept the out-of-phase differential input signal 104b, where the in-phase differential amplifier stage 106a and the out-of-phase differential amplifier stage 106b are referred to herein collectively as differential amplifier stages 106. For example, as illustrated in FIG. 1A, the differential amplifier stages 106 may accept the differential input signals 104 through series capacitors 108.

The in-phase differential amplifier stage 106a and the out-of-phase differential amplifier stage 106b may include any combination or design of components suitable for forming a differential cross-coupled differential amplifier 100 in combination. For example, the in-phase differential amplifier stage 106a and/or the out-of-phase differential amplifier stage 106b may include one or more transistors (e.g., bipolar junction transistors, heterojunction bipolar transistors (HBTs), field-effect transistors (FETs) or any other suitable transistor type). As an illustration, the in-phase differential amplifier stage 106a and/or the out-of-phase differential amplifier stage 106b may include two transistors in a cascode configuration. By way of another example, the in-phase differential amplifier stage 106a and/or the out-of-phase differential amplifier stage 106b may include one or more operational amplifiers.

It is to be understood that the terms "in-phase" and "out-of-phase" used in reference to various aspects of the cross-coupled differential amplifier 100 is solely for illustrative purposes and is not limiting on the present disclosure. For example, the in-phase differential input signal 104a and the out-of-phase differential input signal 104b may be generally understood as arbitrary first and second input signals. In some embodiments, one of the differential input signals 104 may be tied to or otherwise referenced to ground. In this way, a single input signal may be provided as an input to the amplifier. Similarly, the in-phase differential amplifier stage 106a and out-of-phase differential amplifier stage 106b may be generally understood as first and second differential amplifier stages 106, and the in-phase differential output signal 102a and out-of-phase differential output signal 102b may generally be understood as first and second output signals.

The cross-coupled differential amplifier 100 may further include or be coupled to impedance matching circuitry to input or output matching to additional components. For example, impedance matching circuitry may include any combination of active or passive elements known in the art suitable for impedance matching including, but not limited to, resistors, capacitors, inductors, transistors, or transformers.

Figure 1B:
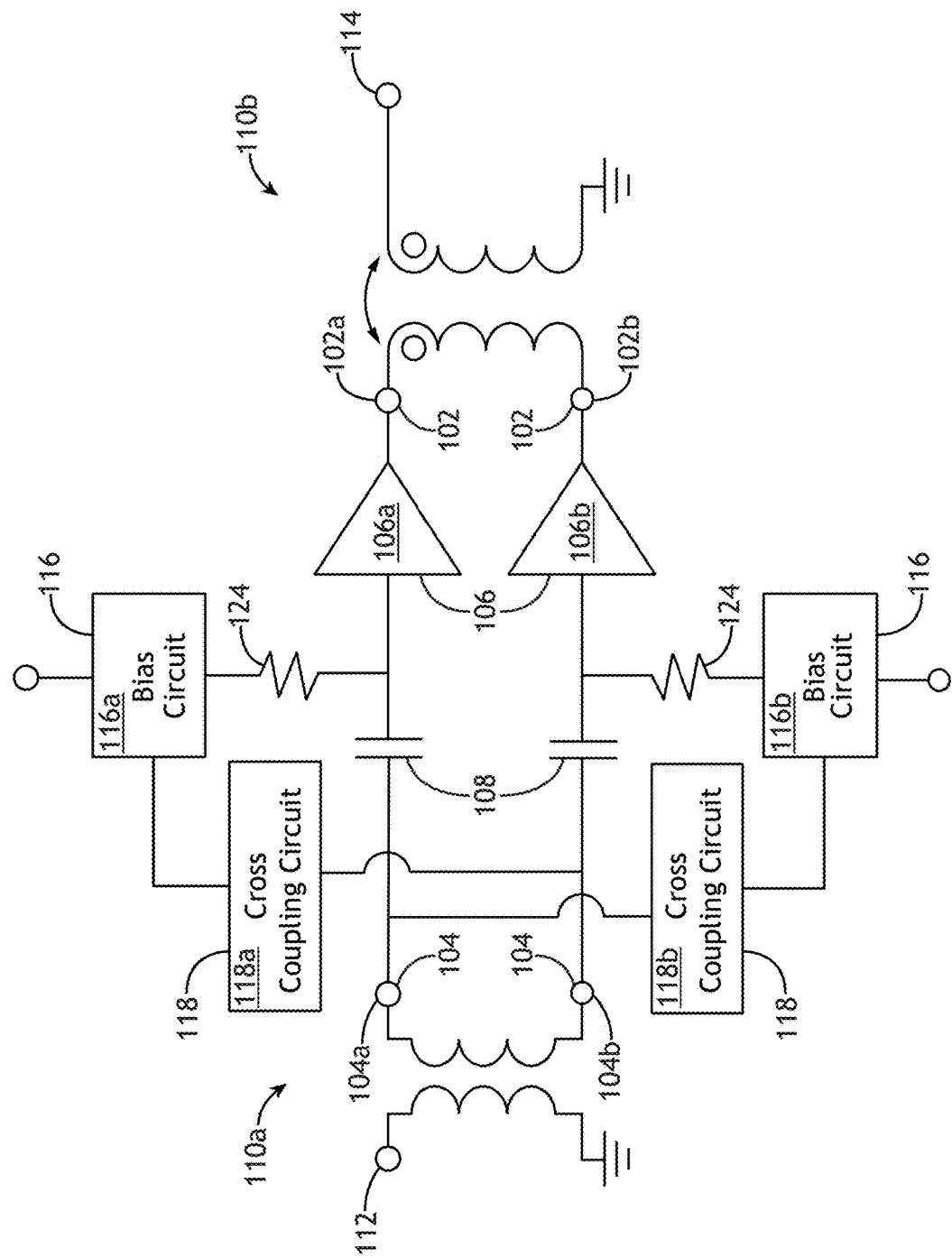
FIG. 1B is a conceptual diagram of a cross-coupled differential amplifier including an input matching circuit and an output matching circuit, in accordance with one or more embodiments of the present disclosure.

FIG. 1B is a conceptual diagram of the cross-coupled differential amplifier 100 including an input matching circuit 110a and an output matching circuit 110b, in accordance with one or more embodiments of the present disclosure. In particular, the input and output matching circuits 110 include transformers (e.g., an input transformer and an output transformer). FIG. 1B further illustrates a configuration in which the cross-coupled differential amplifier 100 includes a single input signal 112 and a single output signal 114, both referenced to ground.

Anti-phase bias control of a cross-coupled differential amplifier 100 using cross-coupled differential input signals 104 will now be described in greater detail in accordance with one or more embodiments of the present disclosure.

Figure 2:
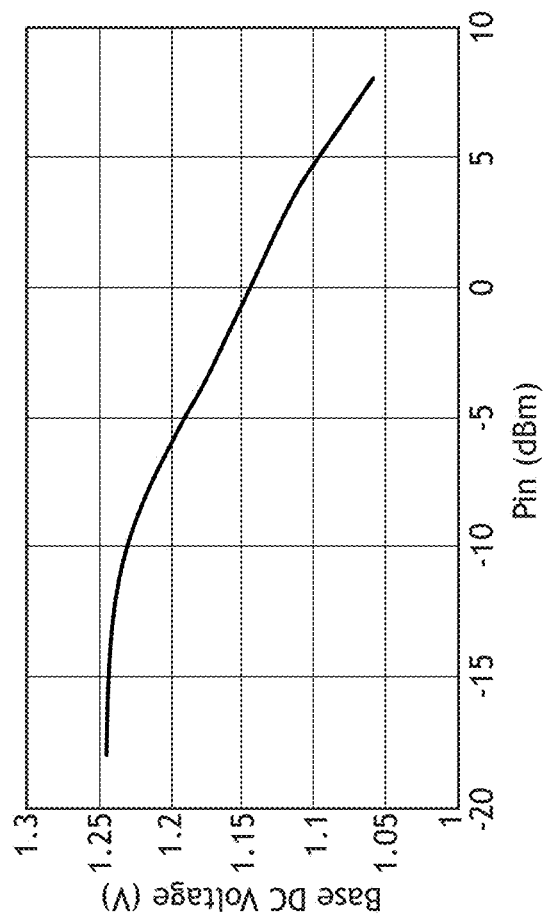
FIG. 2 is a plot illustrating a decrease in the base voltage of a typical amplifier with differential input signals of increasing power, in accordance with one or more embodiments of the present disclosure.

It is contemplated herein that a base voltage of a cross-coupled differential amplifier 100 may change as the power of differential input signals 104 increase due to increased current consumption, thermal issues, or the like. FIG. 2 is a plot illustrating a decrease in the base voltage of a typical amplifier (or amplifier stage) with differential input signals 104 of increasing power, in accordance with one or more embodiments of the present disclosure. As a result, it may be desirable to control the bias level of a cross-coupled differential amplifier 100 to facilitate linear operation in the presence of power variations.

Referring again to FIGS. 1A and 1B, in some embodiments, the cross-coupled differential amplifier 100 includes bias circuits 116 for biasing the differential amplifier stages 106. For example, the cross-coupled differential amplifier 100 may include an in-phase bias circuit 116a (e.g., a first bias circuit 116a) for biasing the in-phase differential amplifier stage 106a and an out-of-phase bias circuit 116b (e.g., a second bias circuit 116b) for biasing the out-of-phase differential amplifier stage 106b.

The bias circuits 116 may include any combination or design of components suitable for controlling the bias conditions of the in-phase differential amplifier stage 106a and/or the out-of-phase differential amplifier stage 106b (e.g., operating points of constituent transistors, or the like). In some embodiments, a bias circuit 116 (e.g., the in-phase bias circuit 116a or the out-of-phase bias circuit 116b) includes a buffer (e.g., a buffer amplifier) to provide selected voltage and current conditions to the corresponding differential amplifier stage 106 (e.g., the in-phase differential amplifier stage 106a or the out-of-phase bias circuit 116b). Such a buffer may be formed using any design with any combination of components known in the art such as, but not limited to, operational amplifiers or transistors.

For example, a bias circuit 116 may include a buffer formed from one or more transistors in a voltage follower configuration (e.g., a configuration providing unity gain) with a selected voltage provided to an input of the buffer to control the operating point of the respective differential amplifier stage 106. As an illustration, a voltage follower may be formed as a BJT in a common collector configuration (e.g., an emitter follower configuration), two cascaded BJTs in common collector configurations forming a Darlington pair, multiple cascaded BJTs, or the like. However, it is to be understood that a bias circuit 116 may include any type of transistor including, but not limited to, a bipolar junction transistor (BJT), a heterojunction bipolar transistor (HBT), a field-effect transistors (FET), a metal-oxide-semiconductor field-effect-transistors (MOSFET), or a psuedomorphic high electron mobility transistors (PHEMT). In this way, any examples herein depicting a particular transistor type are purely illustrative such that such examples may be extended to other transistor types. For instance, a voltage follower may be formed with one or more FETs in a common drain configuration.

In some embodiments, the bias circuits 116 further inject cross-coupled anti-phase signals from opposing differential input signals 104 to provide anti-phase bias control of the differential amplifier stages 106. In this way, a bias control voltage for a particular differential amplifier stage 106 may fluctuate based on variations of an opposing differential input signal 104. It is contemplated herein that such a configuration may provide highly linear and robust bias control across a wide power range (e.g., associated with the high PAPR of 5G mobile communications, or the like). For example, the in-phase bias circuit 116a for the in-phase differential amplifier stage 106a may utilize cross-coupled input from the out-of-phase differential input signal 104b, while the out-of-phase bias circuit 116b for the out-of-phase differential amplifier stage 106b may utilize cross-coupled input from the in-phase differential input signal 104a.

The bias circuits 116 for the differential amplifier stages 106 may be connected to opposing differential input signals 104 using any combination of active or passive elements suitable for providing anti-phase injection for bias control, which are referred to herein as cross-coupling circuits 118. For example, the cross-coupling circuits 118 may include, but are not limited to, one or more capacitors, one or more phase shifters, one or more transistors, or one or more amplifiers (e.g., additional amplifiers for the purpose of providing amplification of opposing differential input signals 104 for bias control purposes). Further, the bias circuits 116 and the cross-coupling circuits 118 may be connected in any suitable configuration for providing anti-phase injection for anti-phase bias control. For example, anti-phase bias control may be achieved by cross-coupling the bias circuits 116 with opposing differential input signals 104 utilizing one or more transistors in various voltage follower configurations such as, but not limited to, a common collector configuration, a common source configuration, a common base configuration, or a common gate configuration. In this way, the opposing differential input signals 104 may be provided as inputs to the voltage followers in the bias circuits 116. In some applications, the bias circuits 116 may further provide a DC voltage to the inputs of the voltage followers such that bias control of the differential amplifier stages 106 may be provided by a combination of a DC voltage and the anti-phase signals.

Figure 1C:
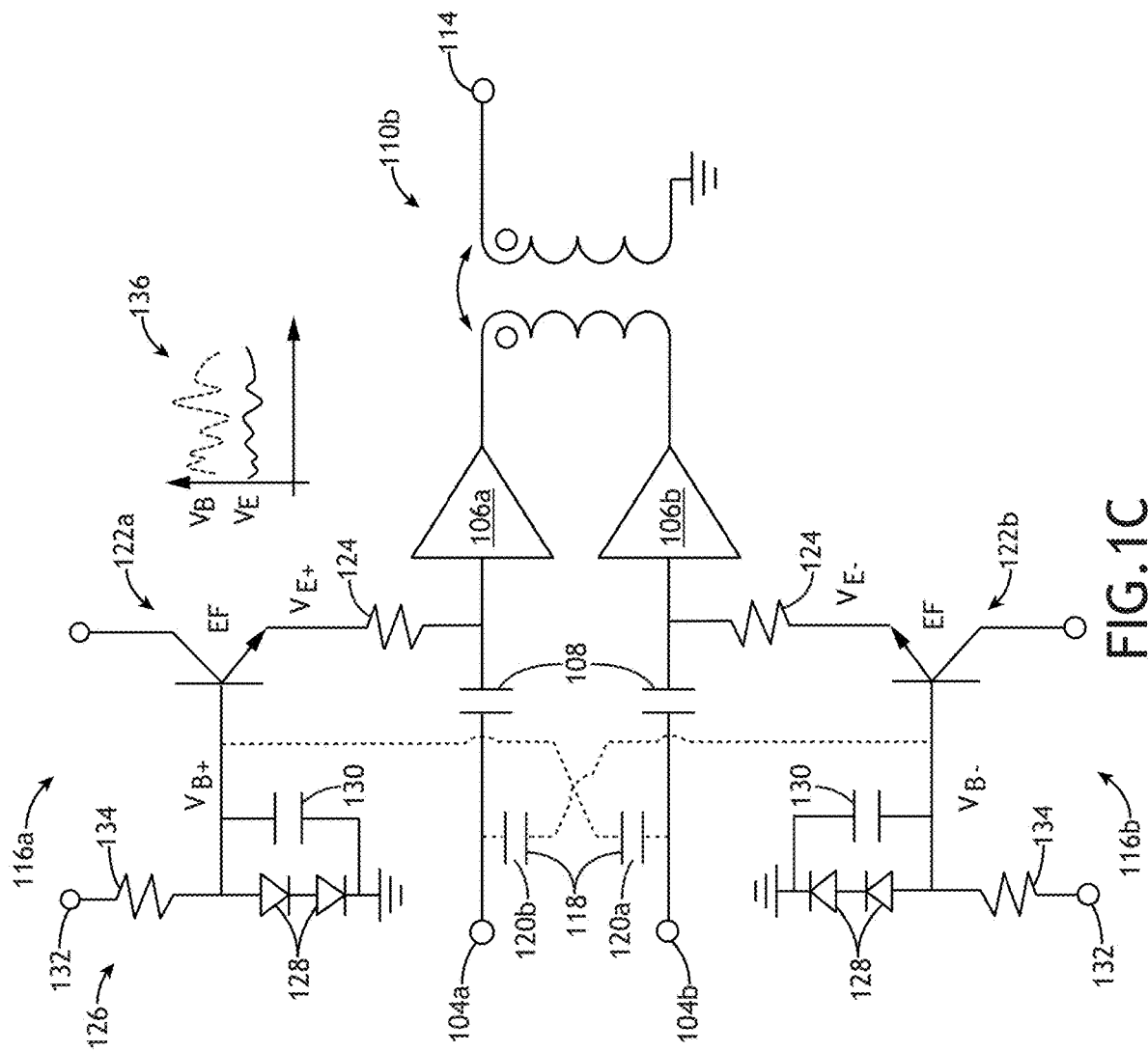
FIG. 1C is a conceptual schematic of a cross-coupled differential amplifier including cross-coupling capacitors between bases of the emitter follow transistors and opposing differential input signals, in accordance with one or more embodiments of the present disclosure.
Figure 1D:
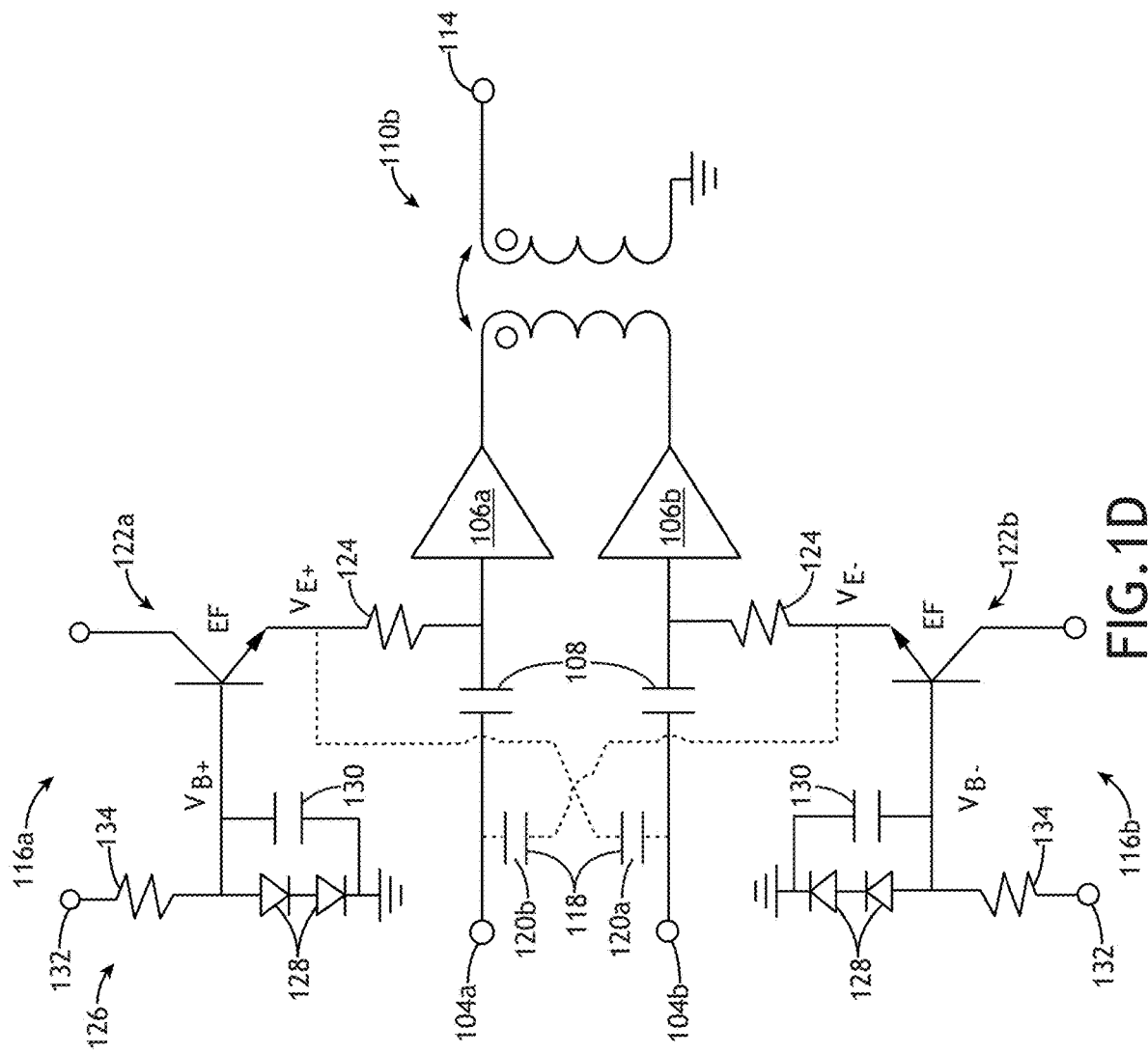
FIG. 1D is a conceptual schematic of a cross-coupled differential amplifier including cross-coupling capacitors between emitters of the emitter follow transistors and opposing differential input signals, in accordance with one or more embodiments of the present disclosure.

In some embodiments, bias circuits 116 for differential amplifier stages 106 are connected to opposing differential input signals 104 via one or more capacitors as the cross-coupling circuits 118. FIGS. 1C and 1D illustrate two non-limiting examples of the use of cross-coupling capacitors 120.

In FIGS. 1C and 1D, the bias circuits 116 are each illustrated as a BJT transistor 122 in a voltage follower configuration (e.g., a voltage follower transistor 122) coupled to the corresponding differential amplifier stage 106 through a resistor 124. In this way, each voltage follower transistor 122 is in an emitter follower configuration. FIGS. 1C and 1D further illustrate bias driving elements 126 coupled to the inputs of the voltage follower transistor 122. In this particular illustration, the base of the voltage follower transistor 122 is connected across one or more diodes 128 and a decoupling capacitor 130 tied to ground, which are connected to a source 132 through a resistor 134. However, it is to be understood that FIGS. 1C and 1D along with the associated descriptions are provided solely for illustrative purposes and should not be interpreted as limiting. Rather, the concepts disclosed herein may be extended to any suitable design of a bias circuit 116 including, but not limited to, different transistor types or different buffer designs.

FIG. 1C is a conceptual schematic of a cross-coupled differential amplifier 100 including cross-coupling capacitors 120 between bases of the voltage follower transistors 122 (e.g., inputs of a buffer generally) and opposing differential input signals 104, in accordance with one or more embodiments of the present disclosure. For example, FIG. 1C illustrates a cross-coupling capacitor 120a connected between the base of the voltage follower transistor 122a of the in-phase bias circuit 116a and an out-of-phase input terminal providing the out-of-phase differential input signal 104b. Similarly, FIG. 1C illustrates a cross-coupling capacitor 120b connected between the base of the voltage follower transistor 122b of the out-of-phase bias circuit 116b and an in-phase input terminal providing the in-phase differential input signal 104a. In this way, anti-phase signals are injected into the base of each voltage follower transistor 122 as illustrated in the inset 136. In particular, the inset 136 illustrates fluctuations at the emitter of the voltage follower transistor 122a (e.g., VE) based on fluctuations in the in-phase differential input signal 104a and anti-phase fluctuations at the base of the voltage follower transistor 122a (e.g., $V_B$) based on fluctuations in the out-of-phase differential input signal 104b. As a result, anti-phase injection provides a fundamental voltage swing across the base and emitter of the voltage follower transistor 122a ($V_{BE}$) that increases with increasing power, which enables consistent linear performance over a wide power range.

It is contemplated herein that the particular values of the cross-coupling capacitors 120 and the elements of the bias circuits 116 (e.g., the decoupling capacitors 120) may be selected to tune the performance of the cross-coupled differential amplifier 100. In this configuration, each of the cross-coupled cross-coupling capacitors 120 forms a capacitive divider with the corresponding decoupling capacitor 130 across the diodes 128. Therefore, if values of the cross-coupling capacitors 120 are increased and values of the decoupling capacitors 120 are decreased, the amount of anti-phase injection to be coupled to the bias circuits 116 is increased. However, the amount of anti-phase injection should be balanced with a delay introduced between an alternative current (AC) signal path of the differential input signals 104 and a direct current (DC) signal paths in the bias circuits 116. Further, the decoupling capacitors 120 both divide the anti-phase signals through the cross-coupling capacitors 120 and also rectify the DC base voltages of the voltage follower transistors 122. As a result, the values of the cross-coupling capacitors 120, the decoupling capacitors 120, and sizes of the voltage follower transistors 122 may be selected to maximize a fundamental voltage swing between base and emitter nodes of voltage follower transistors 122 (or provide a fundamental voltage swing within a selected tolerance), while also providing an acceptable delay between the AC signal path of the differential input signals 104 and the DC path in the bias circuits 116.

FIG. 1D is a conceptual schematic of a cross-coupled differential amplifier 100 including cross-coupling capacitors 120 between emitters of the voltage follower transistors 122 and opposing differential input signals 104, in accordance with one or more embodiments of the present disclosure. The design illustrated in FIG. 1D may be beneficial for, but is not limited to, applications where it is beneficial to have reduced DC voltages associated with the differential amplifier stages 106. For example, suitable DC voltage levels may be dictated by various factors such as, but not limited to, RF system design or HBT processes.

In some embodiments, a cross-coupled differential amplifier 100 includes multi-element cross-coupling circuits 118 between the bias circuits 116 for differential amplifier stages 106 and opposing differential input signals 104. Such multi-element cross-coupling circuits 118 may provide increased control over the amount of anti-phase injection to the bias circuits 116 as well as any delay between the AC signal path of the differential input signals 104 and the DC path in the bias circuits 116.

For example, the cross-coupling circuits 118 may include connected between the bias circuits 116 for differential amplifier stages 106 and opposing differential input signals 104 to provide anti-phase bias control through injection of the opposing differential input signals 104. As another example, cross-coupling circuits 118 may include one or more phase shifters (e.g., AC phase delays) to control phase delays between the delay between the AC signal path of the differential input signals 104 and the DC path in the bias circuits 116.

Figure 1E:
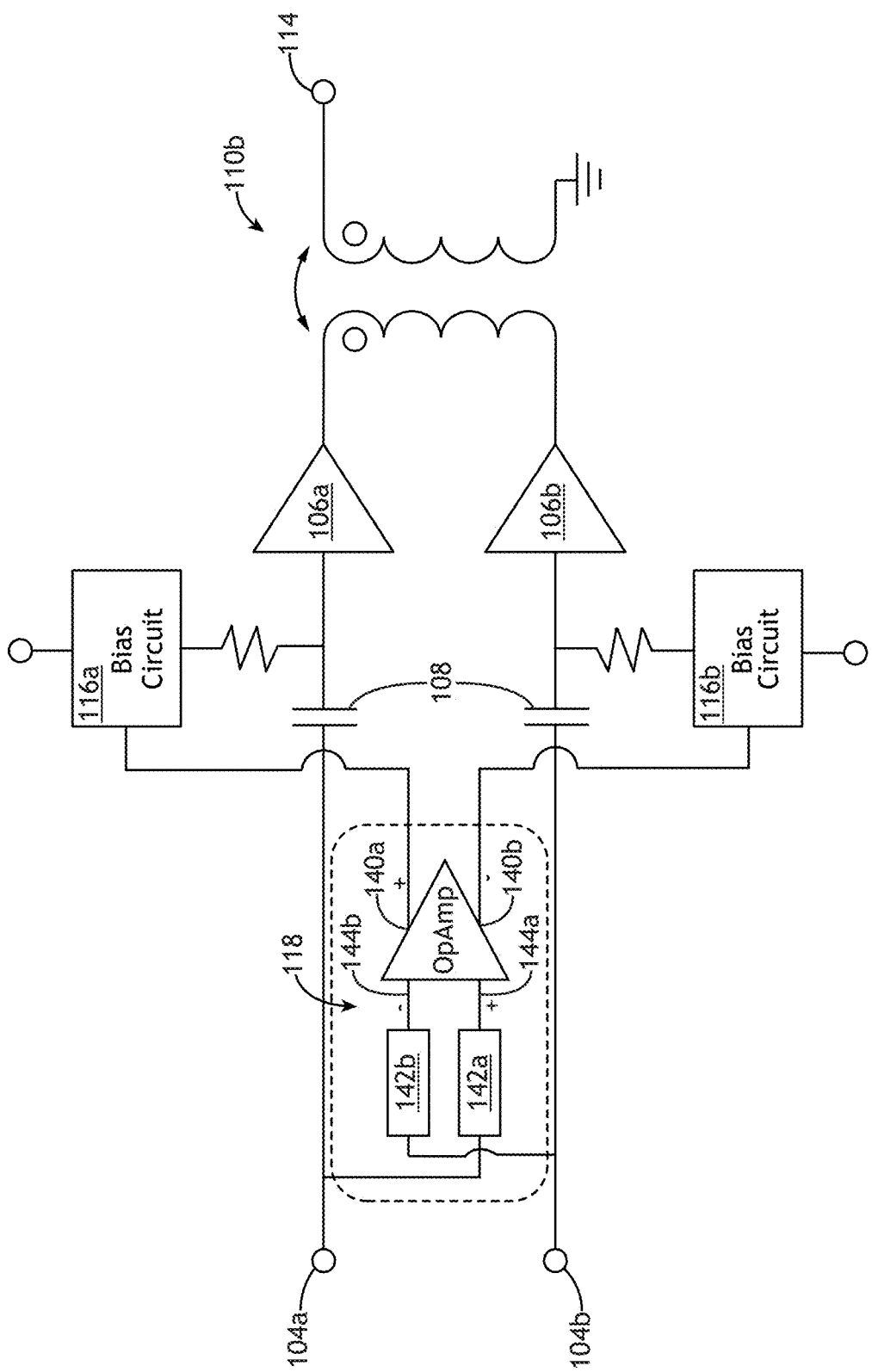
FIG. 1E is a conceptual schematic of a cross-coupled differential amplifier with a cross-coupling circuit including an amplifier and phase shifters, in accordance with one or more embodiments of the present disclosure.

As an illustration, FIG. 1E is a conceptual schematic of a cross-coupled differential amplifier 100 with a cross-coupling circuit 118 including an amplifier and phase shifters, in accordance with one or more embodiments of the present disclosure. The cross-coupling circuit 118 in FIG. 1E includes an amplifier 138 (e.g., a finite gain amplifier for bias control purposes) with a positive source terminal 140*a* connected to the in-phase bias circuit 116*a* and a negative source terminal 140*b* connected to the out-of-phase bias circuit 116*b*.

For example, the positive source terminal 140*a* may be, but is not required to be, connected to the base or emitter of the voltage follower transistor 122 in the in-phase bias circuit 116*a*. Similarly, the negative source terminal 140*b* may be, but is not required to be, connected to the base or emitter of the voltage follower transistor 122 in the out-of-phase bias circuit 116*b*.

The cross-coupling circuit 118 in FIG. 1E further includes a phase shifter 142*a* connected between a positive input terminal 144*a* of the amplifier 138 and the in-phase input terminal providing the in-phase differential input signal 104*a* as well as a phase shifter 142*b* connected between a negative input terminal 144*b* and the out-of-phase input terminal providing the out-of-phase differential input signal 104*b*. In this way, the cross-coupling circuit 118 may provide cross-coupled anti-phase signals to the bias circuits 116. Further, such a design enables selection of an amplitude of the anti-phase signals provided to the bias circuits 116, whereas the phase shifters 142 enables selection of the phase of the anti-phase signals.

Referring generally to FIGS. 1C-1E, it is to be understood that FIGS. 1C-1E and the associated descriptions are provided solely for illustrative purposes and should not be interpreted as limiting. For example, the cross-coupled differential amplifier 100 may include bias circuits 116 having any suitable design such that the particular implementations in FIGS. 1C-1E are non-limiting illustrations. Further, the cross-coupling circuits 118 may connect to the bias circuits 116 in any way suitable for providing anti-phase signals from opposing differential input signals 104 for anti-phase bias control. The cross-coupled differential amplifier 100 may generally include one or more cross-coupling circuits 118 including any combination of active or passive elements such that the particular implementations in FIGS. 1C-1E are non-limiting illustrations.

Figure 1F:
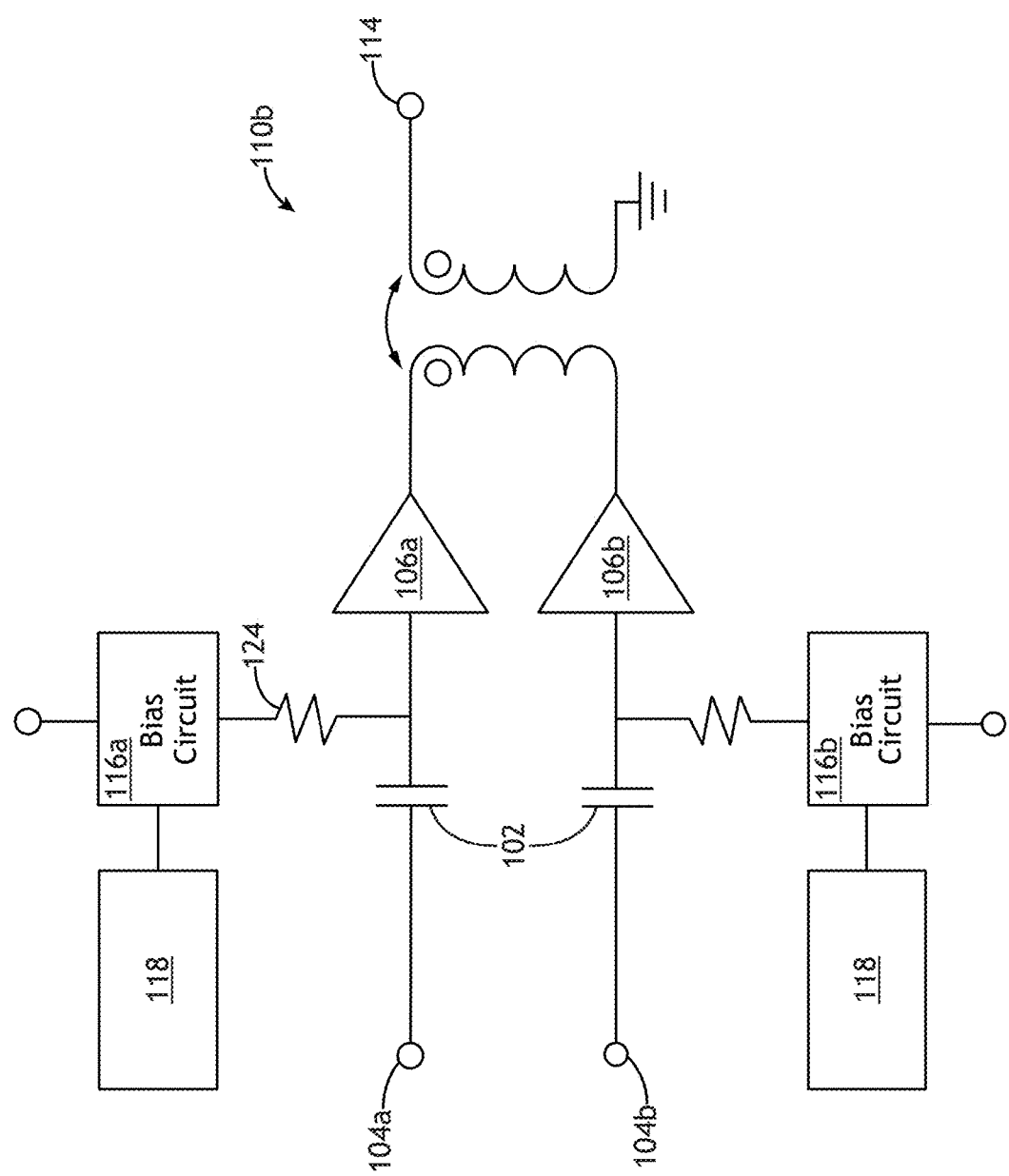
FIG. 1F is a conceptual schematic of a cross-coupled differential amplifier with cross-coupling circuits implemented as external blocks to provide anti-phase injection for bias control.

FIG. 1F is a conceptual schematic of a cross-coupled differential amplifier 100 with cross-coupling circuits 118 implemented as external blocks (e.g., external circuits, or the like) to provide anti-phase injection for bias control. In this way, the cross-coupling circuits 118 may provide any degree of sophistication or fabrication techniques suitable for providing anti-phase injection for bias control.

Referring now to FIGS. 3A-6B, the performance of a cross-coupled differential amplifier 100 is described in greater detail.

One traditional approach to improve the linearity of an amplifier with increasing power of the input signal is to provide coupling between the input signal and bias circuitry for an associated amplifier stage. FIG. 3A is a conceptual block diagram of an amplifier 302 including a traditional coupling circuit 304 to couple a bias circuit 116 to an input signal 112, in accordance with one or more embodiments of the present disclosure.

Figure 3B:
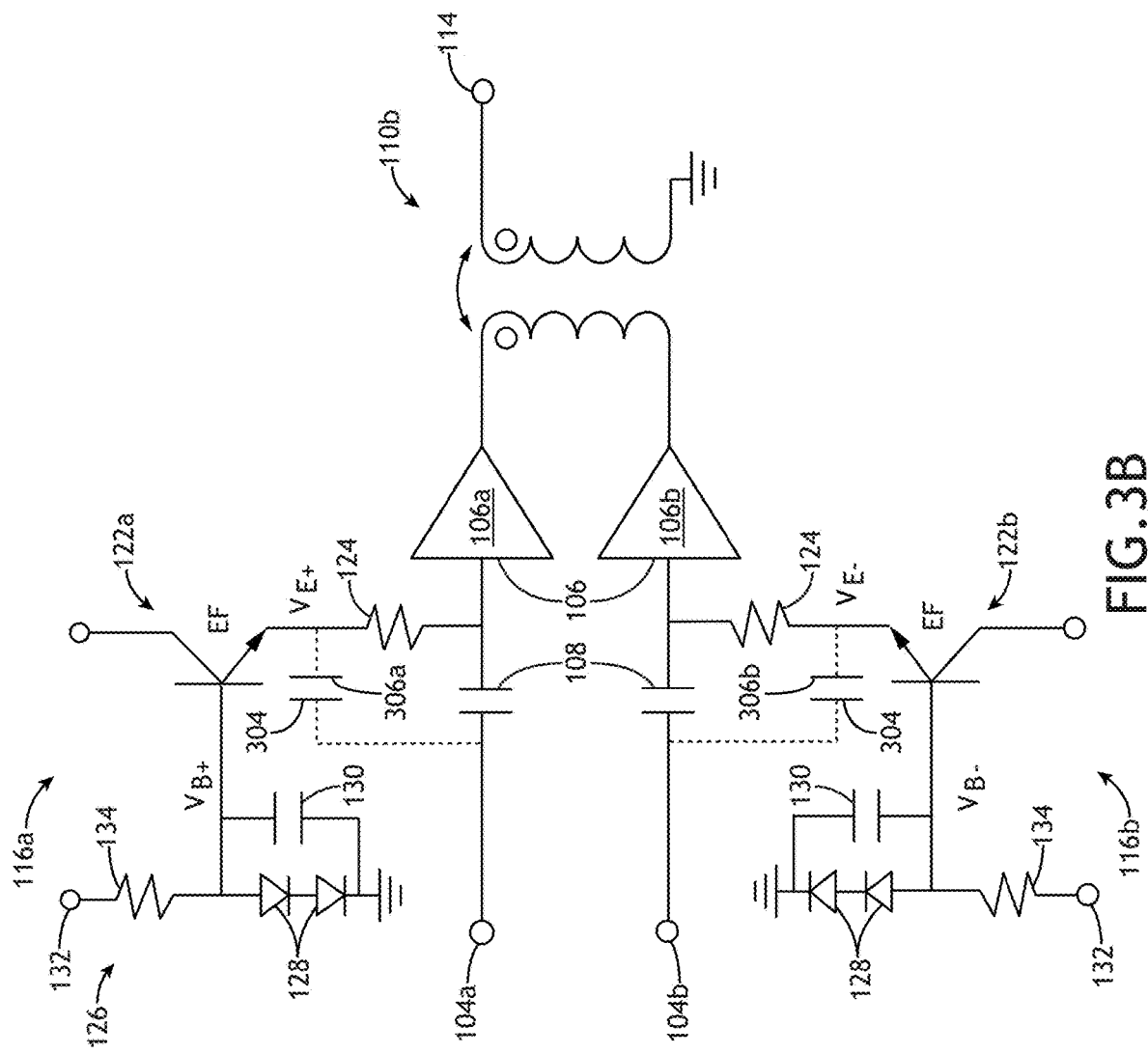
FIG. 3B is a conceptual block diagram of the amplifier in FIG. 3A illustrated as a differential amplifier, in accordance with one or more embodiments of the present disclosure.

FIG. 3B is a conceptual block diagram of the amplifier 302 in FIG. 3A illustrated as a differential amplifier, in accordance with one or more embodiments of the present disclosure. In particular, the architecture of the amplifier 302 in FIG. 3B is similar to the architecture of the cross-coupled differential amplifier 100 in FIG. 3A except for coupling circuitry for bias control. In this way, the impact of the coupling technique for bias control may be more clearly illustrated.

In FIG. 3B, the in-phase bias circuit 116*a* associated with the in-phase differential amplifier stage 106*a* is connected to the in-phase input terminal providing the in-phase differential input signal 104*a* via a capacitor 306*a*. Further, the out-of-phase bias circuit 116*b* associated with the out-of-phase differential amplifier stage 106*b* is connected to the out-of-phase input terminal providing the out-of-phase differential input signal 104*b* via a capacitor 306*b*. In this way, the and the capacitor 306*a* and capacitor 306*b* form the coupling circuit 304 without cross-coupling.

This traditional bias control technique may provide a mechanism for adjusting the bias current to the in-phase differential amplifier stage 106*a* based on a power level of the in-phase differential input signal 104*a* and adjusting the bias current to the out-of-phase differential amplifier stage 106*b* based on a power level of the out-of-phase differential input signal 104*b*. For example, this may provide a relatively low bias current at a relatively low power level and provide a relatively higher bias current as the power levels increase. This configuration may further provide a constant base voltage and a fluctuating emitter voltage in the presence of fluctuations of differential input signals 104 as illustrated in the inset 308.

Another approach (not shown) to improve the linearity of an amplifier circuit may be to provide cross-coupling between differential output signals 102 and opposing differential input signals 104. For example, cross-coupling between output and input signals of an amplifier is generally described in U.S. Pat. No. 7,697,915 issued on Apr. 13, 2010, which is incorporated herein by reference in its entirety.

However, it is contemplated herein that bias control based on traditional bias control techniques without cross-coupling or based on cross-coupling between output and input signals may provide insufficient linearity for demanding applications such as, but not limited to, 5G communications systems. For example, bias control based on cross-coupling between output and input signals is a form of positive feedback that may influence gain peaking and make an amplifier dependent on an output load impedance. It is further contemplated herein that the systems and methods disclosed herein provide simple yet robust bias control.

FIGS. 4A-6B illustrate various plots of performance characteristics of amplifier circuits with different bias control schemes. In particular FIGS. 4A-6B depict the performance of a cross-coupled differential amplifier 100 as depicted in FIG. 1C (labeled as 402), an amplifier 302 as depicted in FIG. 3B (e.g., without cross-coupling) (labeled as 404) and an amplifier with a similar architecture but without any coupling circuitry between bias circuits 116 and the differential input signals 104 (labeled as 406).

Figure 4A:
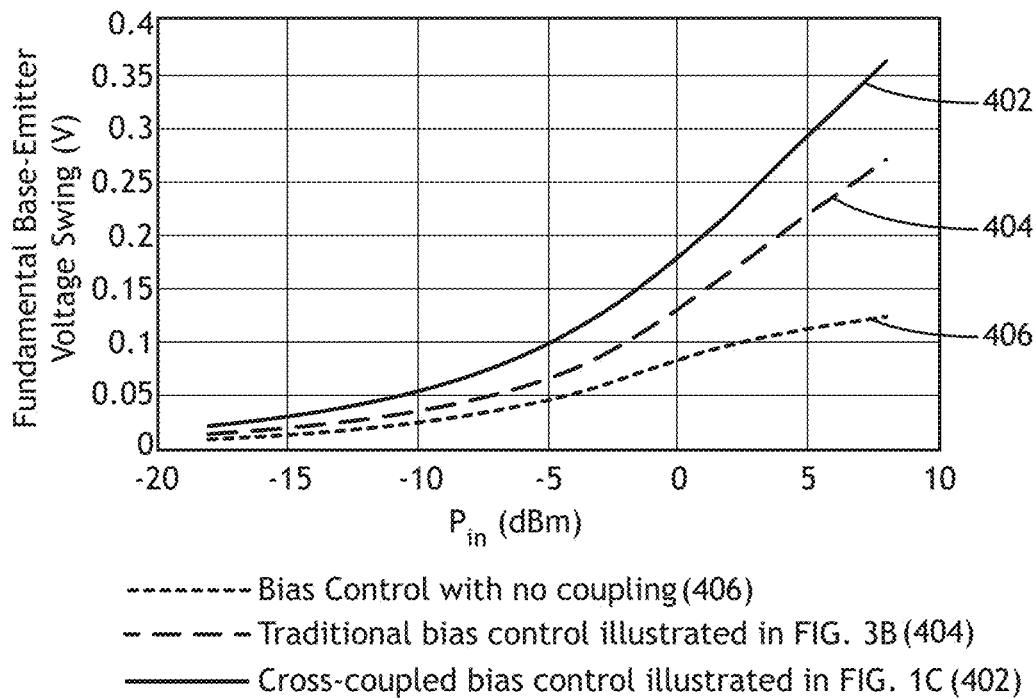
FIG. 4A is a simulated plot of a fundamental voltage swing between base and emitter nodes of an emitter follower transistor in a bias circuit for various bias control techniques, in accordance with one or more embodiments of the present disclosure.
Figure 4B:
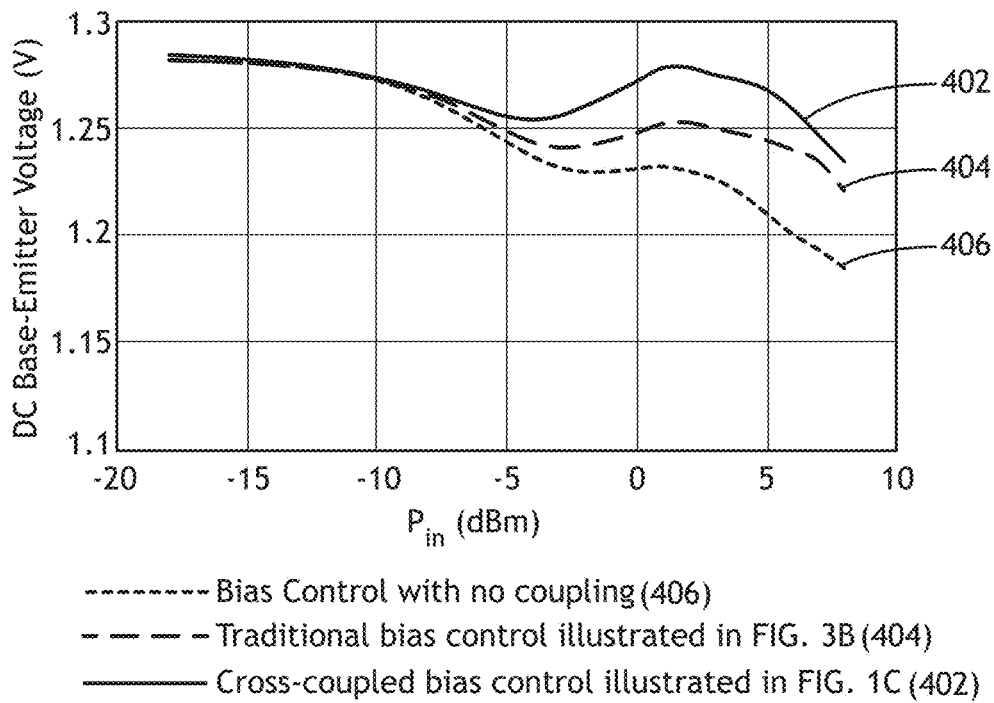
FIG. 4B is a simulated plot of a direct current (DC) voltage between base and emitter nodes of an emitter follower transistor in a bias circuit for various bias control techniques, in accordance with one or more embodiments of the present disclosure.

FIG. 4A is a simulated plot of a fundamental voltage swing between base and emitter nodes of an voltage follower transistor 122 in a bias circuit 116 for various bias control techniques, in accordance with one or more embodiments of the present disclosure. FIG. 4B is a simulated plot of a DC voltage between base and emitter nodes of an voltage follower transistor 122 in a bias circuit 116 for various bias control techniques, in accordance with one or more embodiments of the present disclosure. As illustrated in FIGS. 4A and 4B, traditional coupling between bias circuits 116 for differential amplifier stages 106 and associated differential input signals 104 (e.g., see FIG. 3B) provide better performance across varied power levels than a simple amplifier without any coupling. However, anti-phase bias control based on cross-coupling between bias circuits 116 for differential amplifier stage 106 and opposing differential input signals 104 as disclosed herein (e.g., see FIG. 1C) provides superior performance across the wide range of power levels. For example, anti-phase injection provides a relatively large fundamental voltage swing between the base and emitter of the voltage follower transistor 122 ($V_{BE}$) and maintains more consistent DC voltage with increasing power. In this way, anti-phase injection better compensates voltage drops in the differential amplifier stages 106 due to high current consumption, thermal issues, or the like.

Figure 5A:
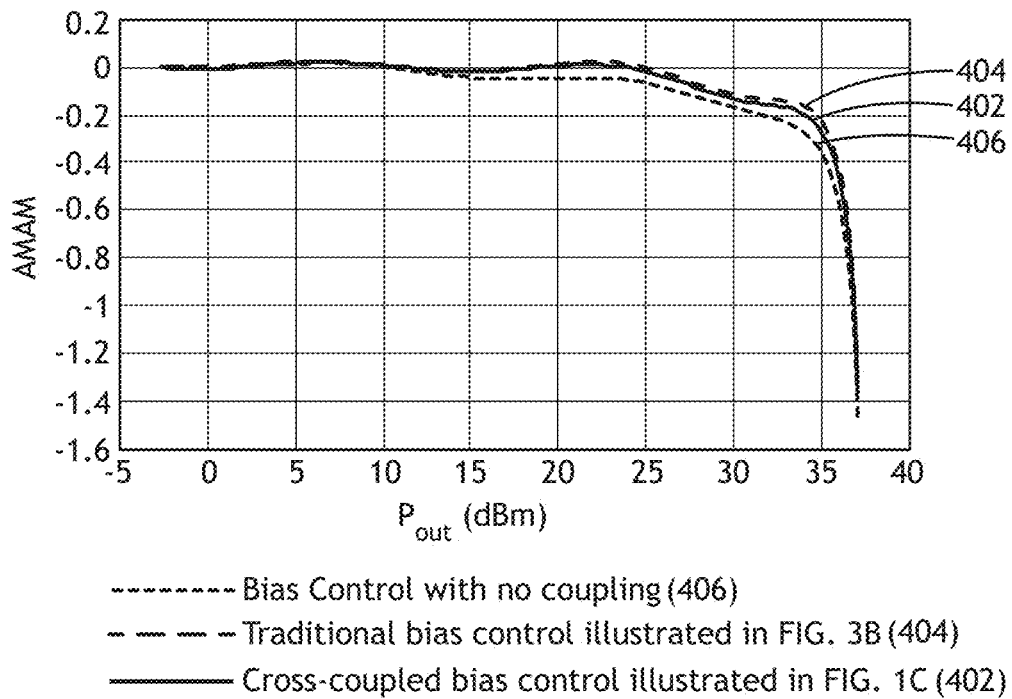
FIG. 5A is a simulated plot of amplitude modulation to amplitude modulation (AMAM) characteristics of amplifiers with various bias control techniques, in accordance with one or more embodiments of the present disclosure.
Figure 5B:
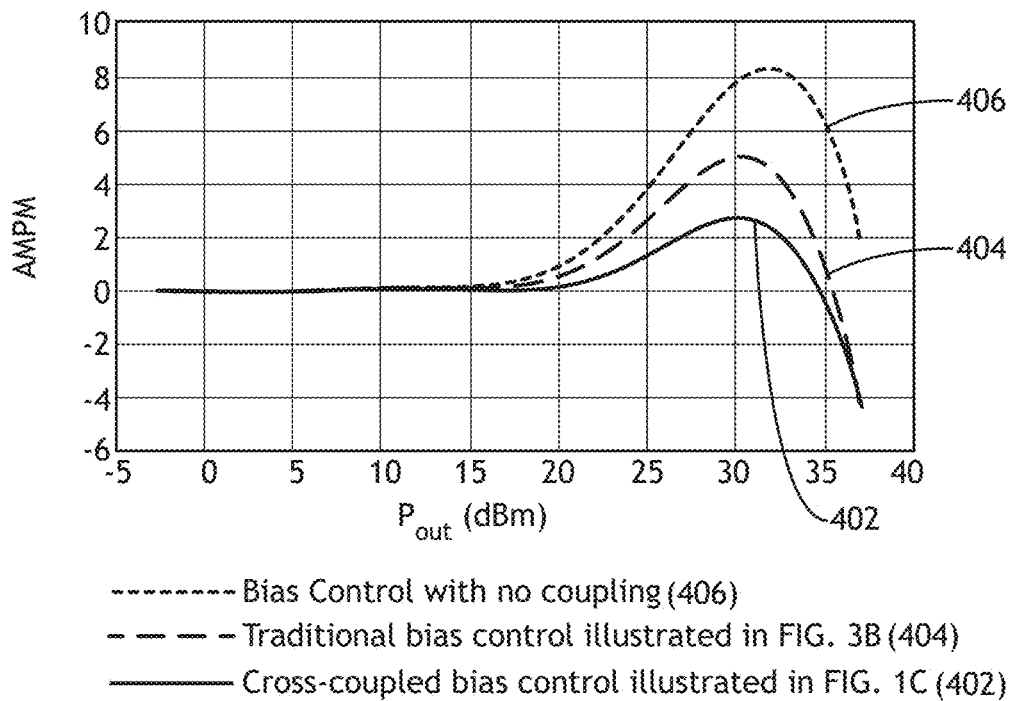
FIG. 5B is a simulated plot of amplitude modulation to phase modulation (AMPM) characteristics of amplifiers with various bias control techniques, in accordance with one or more embodiments of the present disclosure.

FIG. 5A is a simulated plot of amplitude modulation to amplitude modulation (AMAM) characteristics of amplifiers with various bias control techniques, in accordance with one or more embodiments of the present disclosure. FIG. 5B is a simulated plot of amplitude modulation to phase modulation (AMPM) characteristics of amplifiers with various bias control techniques, in accordance with one or more embodiments of the present disclosure.

It is contemplated herein that AMAM and AMPM characteristics illustrated in FIGS. 5A and 5B are some of the primary factors that determine the linearity of an amplifier, where linear operation is achieved when these characteristics are flat (or at least substantially flat within a given tolerance). Further, these characteristics are closely related to a voltage applied at a base node of an voltage follower transistor 122 such as, but not limited to, an HBT.

As illustrated in FIGS. 5A and 5B, anti-phase bias control based on cross-coupled injection of opposing differential input signals 104 to the bias circuits 116 for the differential amplifier stages 106 provides excellent AMAM and AMPM characteristics with relatively flat performance across a wide range of power levels. In particular, FIG. 5B illustrates a substantial improvement based on the disclosed techniques relative to traditional bias control without anti-phase injection through cross-coupling, most notably at relatively higher powers, as indicated by the substantially reduced peak near 30 dBm. These results indicate that bias control via anti-phase injection through cross-coupling as disclosed herein more effectively maintains the base voltage of the cross-coupled differential amplifier 100 than the traditional techniques.

Figure 6A:
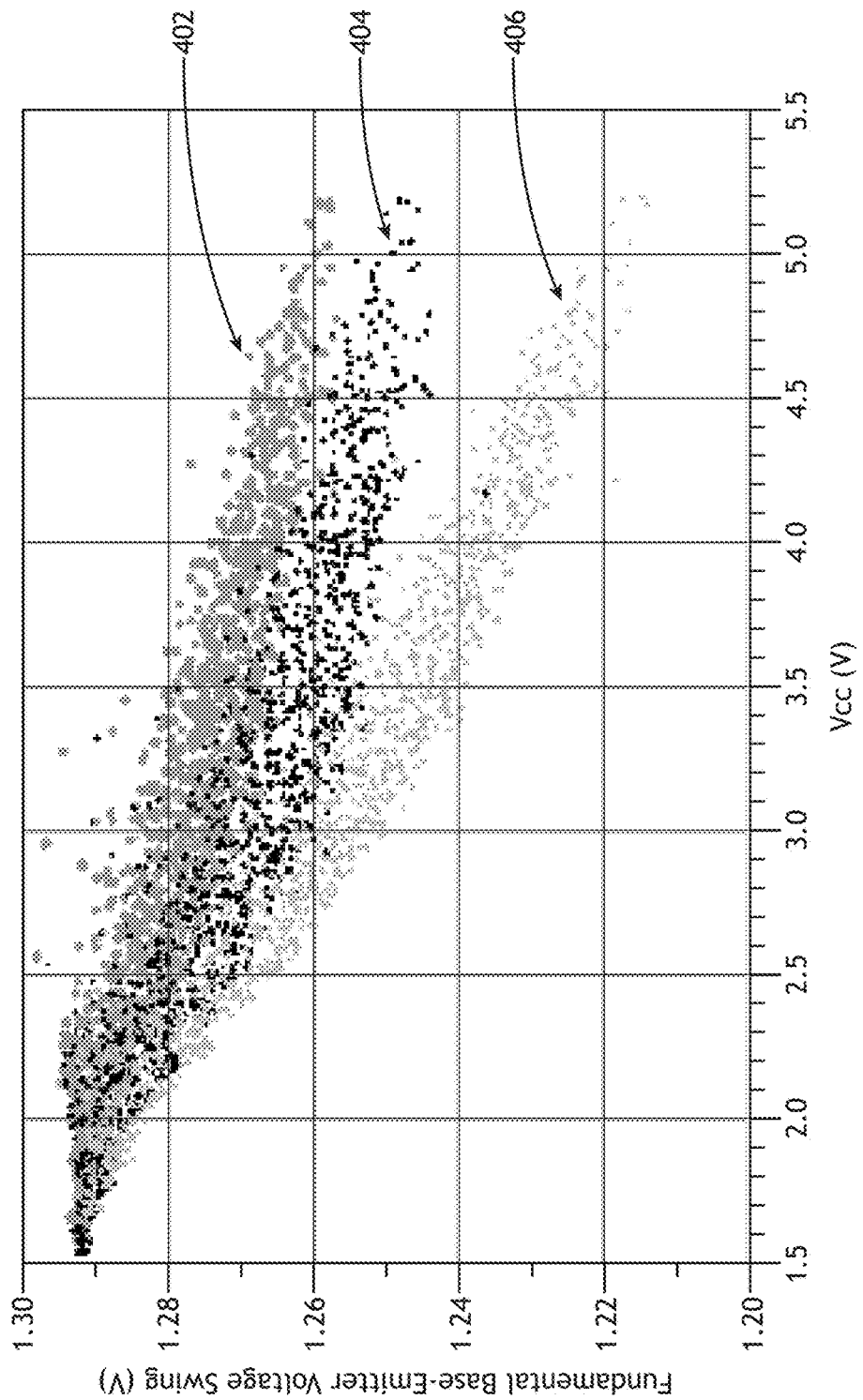
FIG. 6A is an envelope simulation of a base voltage of a differential amplifier stage as a function of a supply voltage (Vcc), in accordance with one or more embodiments of the present disclosure.
Figure 6B:
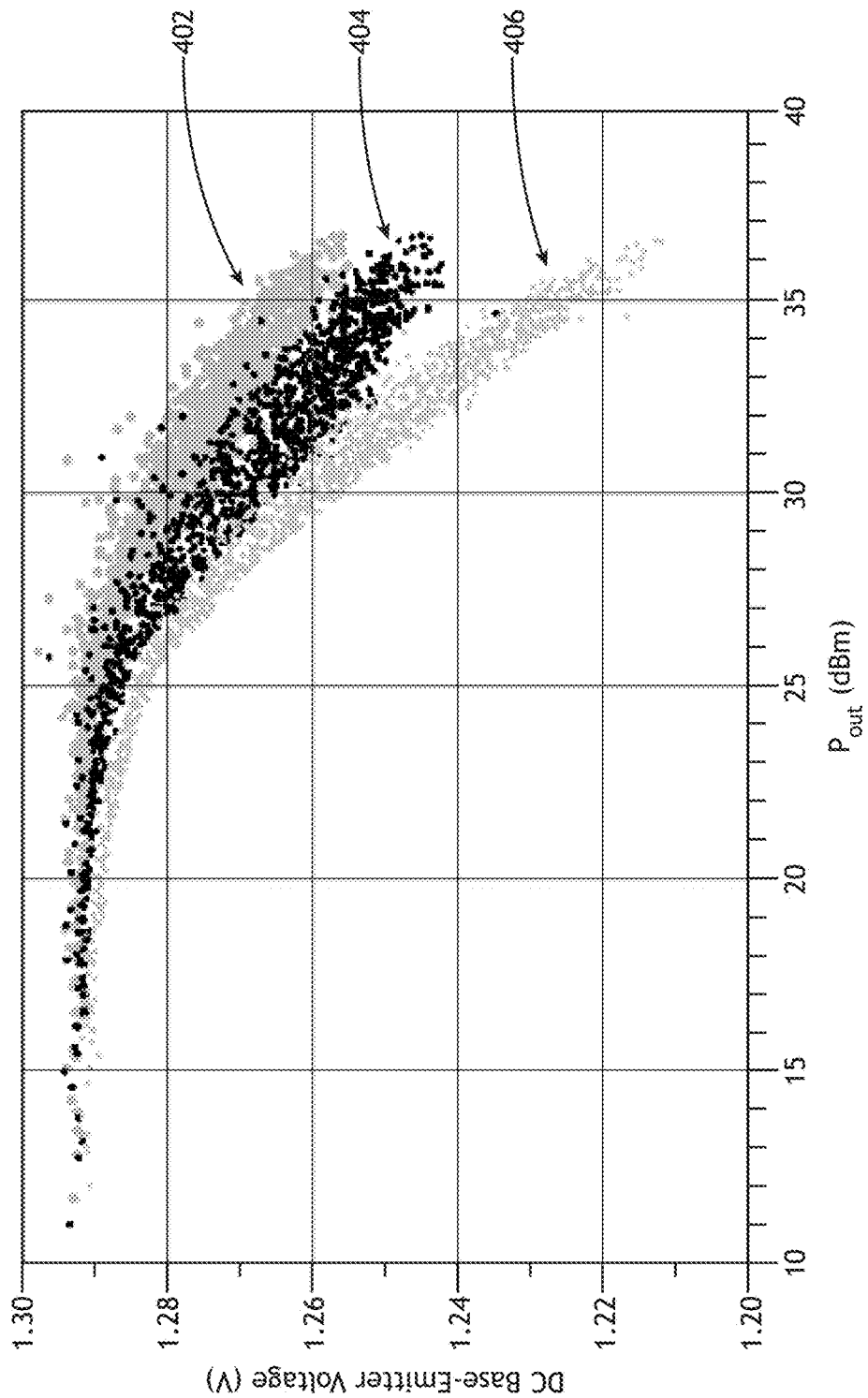
FIG. 6B is an envelope simulation of a base voltage of a differential amplifier stage as a function of a power of a differential output signal, in accordance with one or more embodiments of the present disclosure.

Referring now to FIGS. 6A and 6B, envelope simulations of actual operation of an voltage follower transistor 122 in a bias circuit 116 are illustrated. FIG. 6A is an envelope simulation of a base voltage of a differential amplifier stage 106 as a function of a supply voltage (Vcc), in accordance with one or more embodiments of the present disclosure. FIG. 6B is an envelope simulation of a base voltage of a differential amplifier stage 106 as a function of a power of a differential output signal 102, in accordance with one or more embodiments of the present disclosure. These simulation results illustrate how anti-phase bias control based on cross-coupling between bias circuits 116 of the differential amplifier stages 106 and opposing differential input signals 104 as disclosed herein (e.g., see FIG. 1C) more effectively maintains the base voltage of the differential amplifier stages 106 and thus provides better linearity than traditional bias control techniques.

Figure 7A:
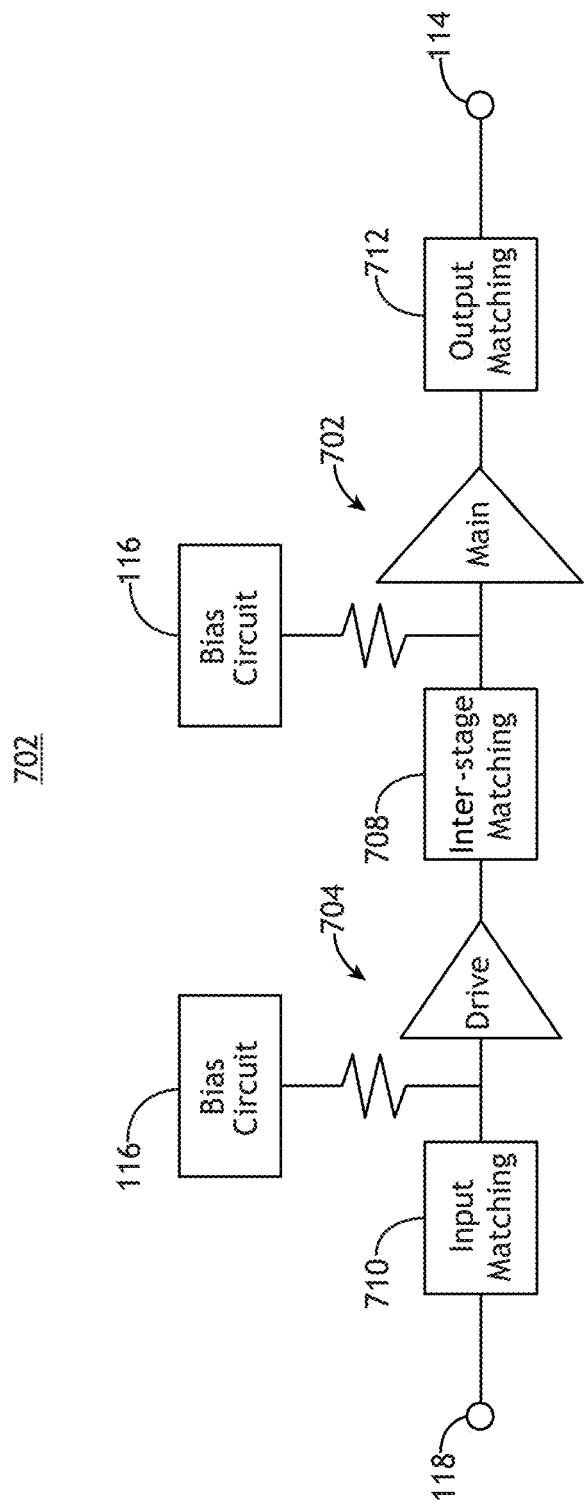
FIG. 7A is a conceptual diagram of a multi-stage amplifier including a main amplifier stage and a drive amplifier stage, in accordance with one or more embodiments of the present disclosure.
Figure 7B:
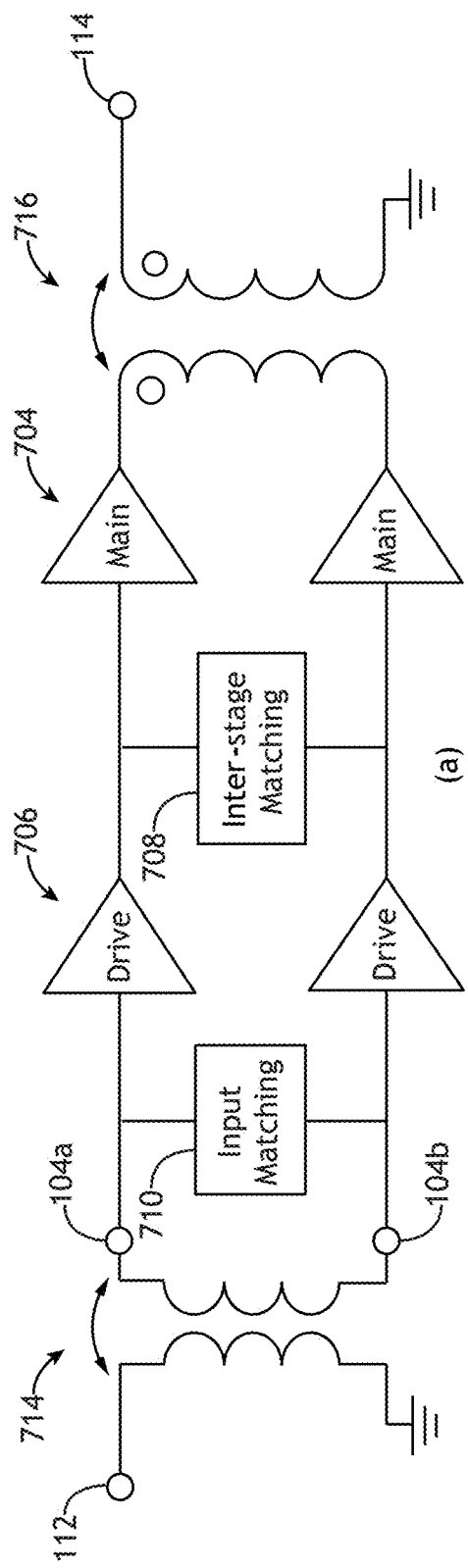
FIG. 7B is a conceptual diagram of a fully differential multi-stage amplifier illustrating multiple differential amplifier stages, in accordance with one or more embodiments of the present disclosure.
Figure 7C:
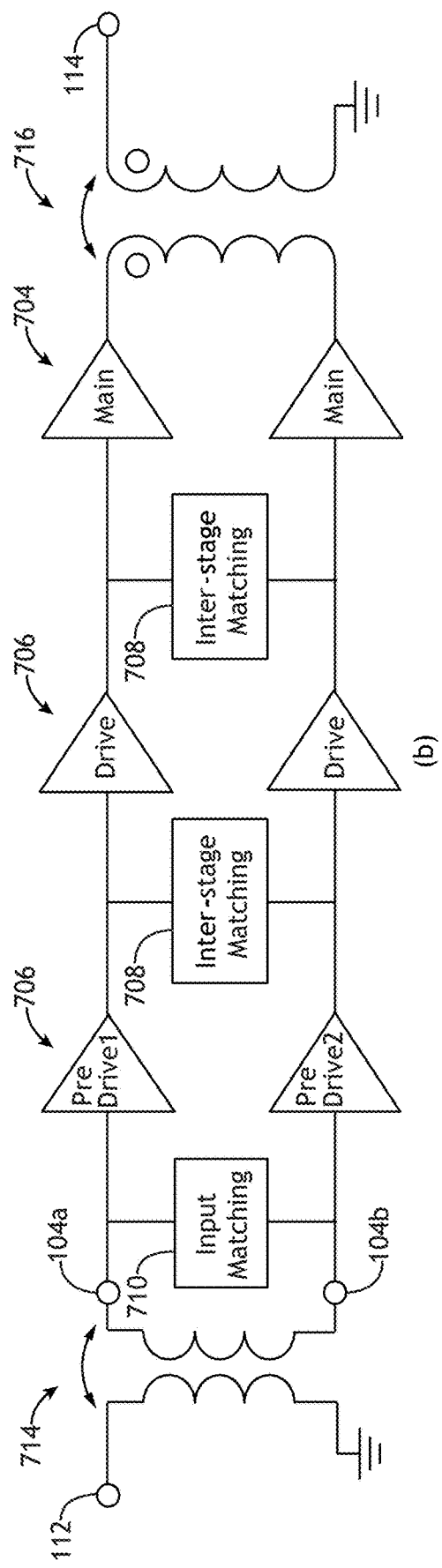
FIG. 7C is a conceptual diagram of a three-stage amplifier, in accordance with one or more embodiments of the present disclosure.

Referring now to FIGS. 7A-7C, various non-limiting examples of the use of RF amplifiers 100 in multi-stage amplifying systems is described, in accordance with one or more embodiments of the present disclosure. It is contemplated herein that many advanced RF amplification systems utilize multi-stage amplification and further contemplated herein that a cross-coupled differential amplifier 100 as disclosed herein may be implemented as any type of amplifier stage.

FIG. 7A is a conceptual diagram of a multi-stage amplifier 702 including a main amplifier stage 704 and a drive amplifier stage 706, in accordance with one or more embodiments of the present disclosure. FIG. 7B is a conceptual diagram of a fully differential multi-stage amplifier 702 illustrating multiple differential amplifier stages 106, in accordance with one or more embodiments of the present disclosure. In a general sense, a multi-stage amplifier 702 may have multiple amplifier stages. As an illustration, FIG. 7C is a conceptual diagram of a three-stage amplifier 702, in accordance with one or more embodiments of the present disclosure. For example, the three-stage amplifier 702 includes a main amplifier stage 704 and two drive amplifier stages 706 (e.g., a pre-drive stage and a drive stage).

As depicted in FIGS. 7A-7C, a multi-stage amplifier 702 may include matching circuitry between the various amplifier stages as well as on input and output ends to provide impedance matching both within the multi-stage amplifier 702 and between the multi-stage amplifier 702 and external devices. For example, FIGS. 7A-7C illustrate inter-stage matching circuits 708, an input matching circuit 710, and an output matching circuit 712. FIGS. 7B-7C additionally depict an input transformer 714 and an output transformer 716, which may further facilitate impedance matching with external components. Additionally, one terminal of both the input transformer 714 and the output transformer 716 are tied to ground. In this configuration, the multi-stage amplifier 702 may accept a single input signal 718 and provide a single output signal 720, but each of the amplifier stages may operate on differential input signals 104.

It is contemplated herein that a main amplifier stage 704 may typically draw a larger current than a drive amplifier stage 706 such that a base voltage of the main amplifier stage 704 may change more rapidly than for the drive amplifier stage 706. Further, the base voltage of the main amplifier stage 704 may decrease with increasing power of the input signal 202, which may be due at least in part to thermal issues. As a result, it may be particularly beneficial to implement the main amplifier stage 704 as a cross-coupled differential amplifier 100 as disclosed herein. However, any amplifier stage of a multi-stage amplifier 702 may be implemented as a cross-coupled differential amplifier 100. For example, one or more of the drive amplifier stages 706 may consume sufficient current to cause a drop of the base voltage at higher power levels. Accordingly, implementing a multi-stage amplifier 702 in which multiple amplifier stages are implemented as cross-coupled differential amplifiers 100 with bias control based on anti-phase injection using cross-coupling as disclosed herein may enable highly linear performance over a wide power range.

Figure 8:
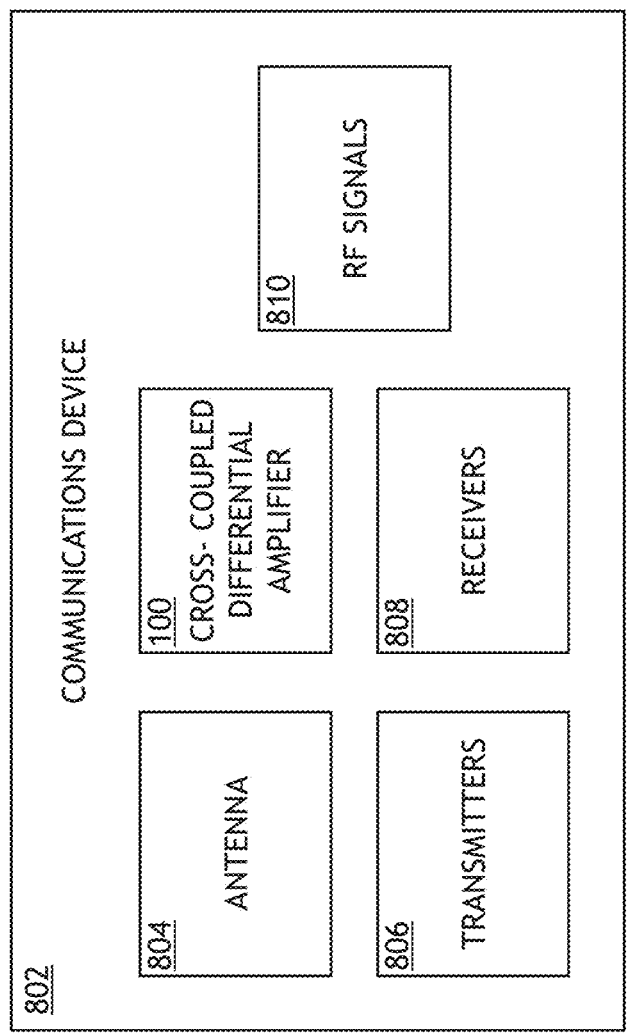
FIG. 8 is a block diagram view of a cross-coupled differential amplifier implemented in a communications device, in accordance with one or more embodiments of the present disclosure.

Referring now to FIG. 8, FIG. 8 is a block diagram view of a cross-coupled differential amplifier 100 implemented in a communications device 802, in accordance with one or more embodiments of the present disclosure. It is contemplated herein that a cross-coupled differential amplifier 100 may be used in any communications device 802 including, but not limited to, a mobile phone, a laptop computer, or a tablet.

In some embodiments, a communications device 802 includes an antenna 804 coupled to one or more transmitters 806 and receivers 808 to facilitate the transmission and/or reception of RF signals 810. The RF signals 810 may have any frequency or frequency ranges such as, but not limited to, MHz to GHz frequencies. Further, the RF signals 810 may be within any designated frequency bands such as, but not limited to, 5G bands or LTE bands.

In some embodiments, the communications device 802 further includes one or more cross-coupled differential amplifiers 100 coupled to the antenna 804 to provide for amplification of the RF signals 810. For example, the communications device 802 may include one or more cross-coupled differential amplifiers 100 to amplify RF signals 810 from the transmitters 806 prior to transmission by the antenna 804.

As an illustration, the communications device 802 may include a transmitter 806 to generate an RF signal 810 for transmission (e.g., an input transmission signal) and one or more cross-coupled differential amplifiers 100 to receive and amplify the input transmission signal. For example, the communications device 802 may include a cross-coupled differential amplifier 100 with an input transformer (e.g., as illustrated in FIGS. 1B, 7B, and 7C) to receive the input transmission signal and generate differential input signals 104 (e.g., first and second input signals). The cross-coupled differential amplifier 100 may then provide amplification of these differential input signals 104 based anti-phase bias control as disclosed herein to generate differential output signals 102 (e.g., first and second amplified output signals). The communications device 802 may then include an output transformer (e.g., as illustrated in FIGS. 1B-1F, 7B and 7C) to provide an amplified transmission signal for broadcast by the antenna 804.

As another example, the communications device 802 may include multiple cross-coupled differential amplifiers 100 tailored to amplify RF signals 810 of different frequencies or frequency bands. It is contemplated herein that the cross-coupled differential amplifiers 100 as disclosed herein may provide highly linear operation across a wide range of power levels and may thus be suitable for advanced communications systems.

It is additionally contemplated herein that cross-coupled differential amplifiers 100 are not limited to mobile communications applications and may generally be used in any communications system. Accordingly, references to mobile communications systems herein are provided solely for illustrative purposes and are not limiting on the present disclosure.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An amplifier comprising:
   a first input terminal configured to receive a first input signal;
   a second input terminal configured to receive a second input signal;
   a differential amplifier providing differential amplification of the first and second input signals, wherein the differential amplifier comprises:
      a first differential amplifier stage to receive the first input signal; and
      a second differential amplifier stage to receive the second input signal;
   a first bias circuit including a first buffer to bias the first differential amplifier stage, wherein the first bias circuit is connected to the second input terminal to provide anti-phase bias control of the first differential amplifier stage based on the second input signal; and
   a second bias circuit including a second buffer to bias the second differential amplifier stage, wherein the second bias circuit is connected to the first input terminal to provide anti-phase bias control of the second differential amplifier stage based on the first input signal.

2. The amplifier of claim 1, wherein at least one of the first buffer of the first bias circuit or the second buffer of the second bias circuit comprises:
one or more transistors in a voltage follower configuration.

3. The amplifier of claim 2, wherein the one or more transistors comprise:
at least one of a heterojunction bipolar transistor (HBT), a bipolar transistor, a field-effect transistor (FET), a metal-oxide-semiconductor field-effect transistor (MOSFET), or a psuedomorphic high electron mobility transistor (PHEMT).

4. The amplifier of claim 2, wherein the first bias circuit is connected to the second input terminal in at least one of a common collector configuration, a common drain configuration, a common base configuration, or a common gate configuration to provide anti-phase bias control of the first differential amplifier stage, wherein the second bias circuit is connected to the first input terminal in at least one of a common collector configuration, a common drain configuration, a common base configuration, or a common gate configuration to provide anti-phase bias control of the second differential amplifier stage.

5. The amplifier of claim 1, wherein the first bias circuit is connected to the second input terminal via one or more first capacitors to provide the anti-phase bias control of the first differential amplifier stage, wherein the second bias circuit is connected to the first input terminal via one or more second capacitors to provide the anti-phase bias control of the second differential amplifier stage.

6. The amplifier of claim 1, wherein the first bias circuit is connected to the second input terminal via at least one of a first additional amplifier or a first phase shifter to provide the anti-phase bias control of the first differential amplifier stage, wherein the second bias circuit is connected to the first input terminal via at least one of a second additional amplifier or a second phase shifter to provide the anti-phase bias control of the second differential amplifier stage.

7. A multi-stage amplifier comprising:
two or more amplifier stages, wherein at least one of the two or more amplifier stages comprises:
a first input terminal configured to receive a first input signal;
a second input terminal configured to receive a second input signal;
a differential amplifier providing differential amplification of the first and second input signals, wherein the differential amplifier comprises:
a first differential amplifier stage including one or more transistors and configured to receive the first input signal; and
a second differential amplifier stage including one or more transistors and configured to receive the second input signal;
a first bias circuit including a first buffer to bias the first differential amplifier stage, wherein the first bias circuit is connected to the second input terminal to provide anti-phase bias control of the first differential amplifier stage; and
a second bias circuit including a second buffer to bias the second differential amplifier stage, wherein the second bias circuit is connected to the first input terminal to provide anti-phase bias control of the second differential amplifier stage.

8. The multi-stage amplifier of claim 7, wherein at least one of the first buffer of the first bias circuit or the second buffer of the second bias circuit comprises:
one or more transistors in a voltage follower configuration.

9. The multi-stage amplifier of claim 8, wherein the one or more transistors comprise:
at least one of a heterojunction bipolar transistor (HBT), a bipolar transistor, a field-effect transistor (FET), a metal-oxide-semiconductor field-effect transistor (MOSFET), or a psuedomorphic high electron mobility transistor (PHEMT).

10. The multi-stage amplifier of claim 8, wherein the first bias circuit is connected to the second input terminal in at least one of a common collector configuration, a common drain configuration, a common base configuration, or a common gate configuration to provide anti-phase bias control of the first differential amplifier stage, wherein the second bias circuit is connected to the first input terminal in at least one of a common collector configuration, a common drain configuration, a common base configuration, or a common gate configuration to provide anti-phase bias control of the second differential amplifier stage.

11. The multi-stage amplifier of claim 7, wherein the first bias circuit is connected to the second input terminal via one or more first capacitors to provide the anti-phase bias control of the first differential amplifier stage, wherein the second bias circuit is connected to the first input terminal via one or more second capacitors to provide the anti-phase bias control of the second differential amplifier stage.

12. The multi-stage amplifier of claim 7, wherein the first bias circuit is connected to the second input terminal via at least one of a first additional amplifier or a first phase shifter to provide the anti-phase bias control of the first differential amplifier stage, wherein the second bias circuit is connected to the first input terminal via at least one of a second additional amplifier or a second phase shifter to provide the anti-phase bias control of the second differential amplifier stage.

13. The multi-stage amplifier of claim 7, further comprising:
one or more matching circuits between at least two of the two or more amplifier stages.

14. A communications device comprising:
a transmitter to generate an input transmission signal;
one or more amplifiers configured to receive the input transmission signal, wherein at least one of the one or more amplifiers comprises:
an input transformer to receive the input transmission signal and generate a first input signal and a second input signal;
a first input terminal configured to receive the first input signal;
a second input terminal configured to receive the second input signal;
a differential amplifier providing differential amplification of the first and second input signals, wherein the differential amplifier comprises:
a first differential amplifier stage including one or more transistors and configured to receive the first input signal; and
a second differential amplifier stage including one or more transistors and configured to receive the second input signal;
a first bias circuit including a first buffer to bias the first differential amplifier stage, wherein the first bias circuit is connected to the second input terminal to provide anti-phase bias control of the first differential amplifier stage; and a second bias circuit including a second buffer to bias the second differential amplifier stage, wherein the second bias circuit is connected to the first input terminal to provide anti-phase bias control of the second differential amplifier stage, wherein the first and second differential amplifier stages provide first and second amplified output signals;

an output transformer configured to receive the first and second amplified output signals and generate an amplified transmission signal; and an antenna configured to broadcast the amplified transmission signal.

15. The communications device of claim 14, wherein at least one of the first buffer of the first bias circuit or the second buffer of the second bias circuit comprises:

one or more transistors in a voltage follower configuration.

16. The communications device of claim 15, wherein the one or more transistors comprise:

at least one of a heterojunction bipolar transistor (HBT), a bipolar transistor, a field-effect transistor (FET), a metal-oxide-semiconductor field-effect transistor (MOSFET), or a psuedomorphic high electron mobility transistor (PHEMT).

17. The communications device of claim 15, wherein the first bias circuit is connected to the second input terminal in at least one of a common collector configuration, a common drain configuration, a common base configuration, or a common gate configuration to provide anti-phase bias control of the first differential amplifier stage, wherein the second bias circuit is connected to the first input terminal in at least one of a common collector configuration, a common drain configuration, a common base configuration, or a common gate configuration to provide anti-phase bias control of the second differential amplifier stage.

18. The communications device of claim 14, wherein the first bias circuit is connected to the second input terminal via one or more first capacitors to provide the anti-phase bias control of the first differential amplifier stage, wherein the second bias circuit is connected to the first input terminal via one or more second capacitors to provide the anti-phase bias control of the second differential amplifier stage.

19. The communications device of claim 14, wherein the first bias circuit is connected to the second input terminal via at least one of a first additional amplifier or a first phase shifter to provide the anti-phase bias control of the first differential amplifier stage, wherein the second bias circuit is connected to the first input terminal via at least one of a second additional amplifier or a second phase shifter to provide the anti-phase bias control of the second differential amplifier stage.

20. The communications device of claim 14, wherein the one or more amplifiers comprise:

two or more amplifiers configured for different frequencies associated with the input transmission signal.

* * * * *